United States Patent [19]
Lee et al.

[11] Patent Number: 5,859,571
[45] Date of Patent: Jan. 12, 1999

[54] FREQUENCY TRIMMABLE OSCILLATOR AND FREQUENCY MULTIPLIER

[75] Inventors: Peter W. Lee, Saratoga, Calif.; Hsing-Ya Tsao; Fu-Chang Hsu, both of Taipei, Taiwan

[73] Assignee: Aplus Integrated Circuits, Inc., Saratoga, Calif.

[21] Appl. No.: 814,913

[22] Filed: Mar. 11, 1997

[51] Int. Cl.[6] .......................... H03B 19/14; H03K 3/354
[52] U.S. Cl. .......................... 331/53; 331/111; 331/143; 331/179
[58] Field of Search .................................. 331/111, 143, 331/53, 179

[56] References Cited

U.S. PATENT DOCUMENTS

| | | | |
|---|---|---|---|
| 5,070,311 | 12/1991 | Nicolai | 331/111 |
| 5,155,452 | 10/1992 | Ueda et al. | 331/111 |
| 5,565,819 | 10/1996 | Cooper | 331/111 |

*Primary Examiner*—Siegfried H. Grimm
*Attorney, Agent, or Firm*—Flehr Hohbach Test Albritton & Herbert, LLP

[57] ABSTRACT

A pure MOS-implementable oscillator requires no trimming to make the oscillation frequency Vdd independent, but permits trimming to compensate for process and fabrication variations. A current generator creates a core reference current Iosc0, mirrored programmable trim currents, and dynamic reference voltages that do not require a constant Vdd source. A programmable delay unit provides value-programmable capacitors that receive mirrored currents A×(M/N)×Iosc0, where A is a MOS channel W/L ratio constant, and M and N are integers. The currents create ramp-like voltage signals across the capacitors, the slewrate being A×(M/N)×Iosc0/capacitance. A comparator unit compares the ramp-like signals, which ramp-down from Vdd, against a (Vdd−Vt) reference voltage (Vt being a MOS threshold voltage). The comparator unit outputs complementary signals that toggle a set-reset flipflop, whose output is the oscillator output signal. This signal is fedback to the programmable delay unit to toggle on and off the current flow that determines oscillation period. Frequency change due to discrepancies between anticipated and realized load resistors and capacitors may be coarse and/or fine trimmed, for example by incrementally varying M and/or by turning-on a current-providing MOS device having an appropriate W/L value for A. The oscillator includes two programmable delay paths and can accept an input oscillator signal and output a signal whose frequency is a non-integer or integer multiple, simply by varying capacitor ratios.

20 Claims, 12 Drawing Sheets

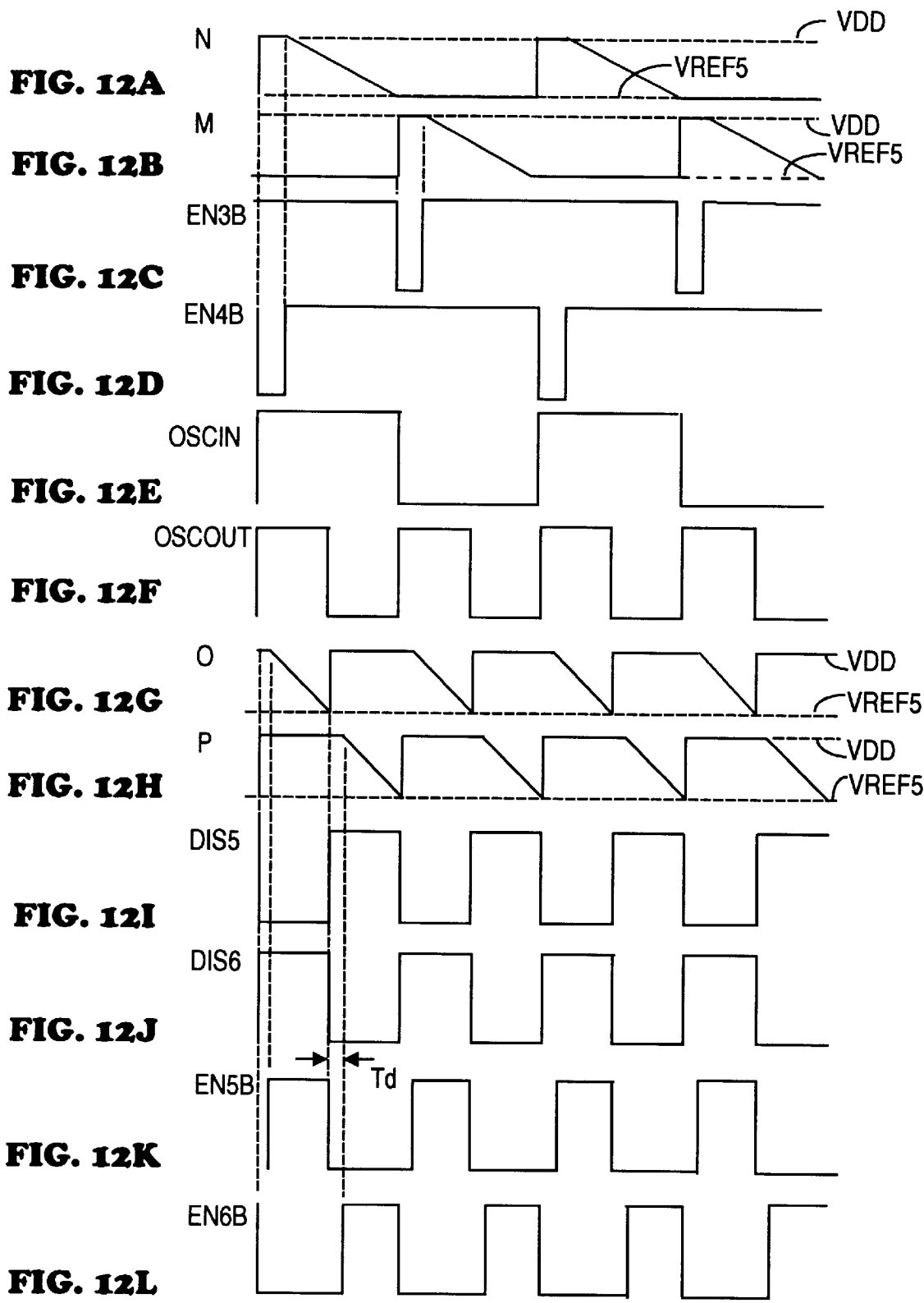

FREQUENCY TRIMMABLE OSCILLATOR AND FREQUENCY MULTIPLIER

FIELD OF THE INVENTION

The present invention relates to oscillators that output a signal at a stable frequency. More particuarly, the present invention relates to oscillators having an output signal that is substantially independent of power supply variation and that may be trimmed to be independent of fabrication process and variations. Further, the present invention relates to such oscillators as may be implementable entirely using MOS or CMOS processes, and that can provide an output frequency that can conveniently be multiplied by integers and by non-integers.

BACKGROUND OF THE INVENTION

Oscillator circuits are used in applications that can range from test circuitry to speech synthesizers, and may be called upon to output a stable frequency over a range from perhaps 1 KHz to perhaps 1 MHz. Although it is desirable that the output frequency be stable and reasonably predictable before any frequency trimming is carried out, implementing such oscillators has proved to be a challenge. The output of such oscillators is often used to trigger other circuitry, and thus high noise immunity is also a requirement. To avoid having to tightly regulate the source of operating potential Vdd, the oscillator frequency should be substantially independent of variations in Vdd. Further, the oscillator frequency should be substantially independent of variations in the fabrication processes used to construct the oscillator.

FIGS. 1A and 1B depict conventional oscillator circuitry, according to the prior art. FIG. 1A is a simplification of a bipolar circuit found in the popular 555 astable oscillator integrated circuit ("IC"). Current flow (i) into a timing capacitor ($C_t$) changes the voltage (v) appearing across the capacitor as a function of time (t) according to the equation:

$$i = C_t dv/dt$$

The bipolar circuit of FIG. 1A requires several on-chip resistors (e.g., R1, R2, R3) in addition to off-chip resistors Rta, Rtb and the off-chip timing capacitor $C_t$. The off-chip passive components Rta, Rtb, $C_t$ add to the size and cost of the overall oscillator unit.

Circuits such as shown in FIG. 1A rely upon a hopefully fixed voltage reference that is input to one or more comparators. The ramp voltage appearing across a timing capacitor in response to a hopefully constant current is then compared to this fixed reference voltage to determine an oscillation period.

The frequency (f) of the oscillator output signal (OSCOUT) provided from the circuit of FIG. 1A is given by the equation:

$$f = t/T = 1.44/(Rta + 2 \times Rtb) \times C_t$$

where T is the period of the oscillator frequency.

Unless the current into the timing capacitor $C_t$ is maintained substantially constant, and unless the reference threshold voltage is substantially constant, the OSCOUT frequency will vary, assuming of course that $C_t$ is itself suitably stable. But maintaining a constant current and constant reference voltage requires maintaining good regulation on the power supply Vdd, as well as maintaining constant values for the resistors Rta, Rtb in the current path. Understandably it can be difficult to predict what the frequency f will be, without trimming one or more component values and/or adjusting voltage levels.

FIG. 1B depicts a so-called constant current relaxation oscillator unit, whose implementation requires complementary metal-oxide-silicon ("CMOS") devices as well as a bipolar bandgap generator to provide a reference input voltage Vref. Such a circuit is disclosed in U.S. Pat. No. 5,352,934 (1994) to Khan. The frequency of the OSCOUT output signal from this oscillator circuit is given by the following equation, where B is a constant and Iosc is constant current:

$$f = 1/T = B \times Iosc/(Vref \times Cap)$$

The period of oscillator (T or $T_{osc}$) is given by:

$$T_{osc} = A \times Cap \times (Vref/Iosc)$$

where A is a constant, Vref is a fixed reference voltage toward which capacitors Cap charge, and (Vref/Iosc)≈R, an equivalent resistance.

Cycle time $T_{osc}$ of the oscillator clock circuit is proportional to the R×Cap product and scaling constant A. As such, we may write:

$$T_{osc} = A \times Cap \times R$$

If Cap is stable in magnitude, the frequency or clock period will be stable providing that R is stable. The value of R will be stable providing that the quotient (Vref/Iosc) is stable.

In FIG. 1B, Vref is maintained substantially stable by using a bandgap reference generator to provide this reference voltage. However, bandgap generators require bipolar circuitry and can be very tricky to properly design. Also, the resultant overall oscillator circuit will combine bipolar devices (in the bandgap generator) and CMOS devices, and be BiCMOS, which requires a more complicated and expensive fabrication than a strictly CMOS circuit implementation. Some oscillator circuits are implemented using pure CMOS but with parasitic bipolar components, and thus require careful and accurate characterization of the parasitic bipolar devices in the normal CMOS devices. In such implementation, good circuit design requires that very special attention be paid to the bipolar portion (be it BiCMOS or parasitic bipolar) of the circuit to reduce parasitic contributions from the bipolar transistors.

But even with a stable value of Vref, the oscillator frequency for the circuit of FIG. 1B will still be very sensitive to variations in the Cap value and in Iosc variations. Variations in Iosc can result from variations in the process used to fabricate the overall circuit, as well as variations in the power supply Vdd.

To summarize, there is a need for a stable oscillator that may be economically implemented using CMOS techniques, without need for bipolar devices. Such oscillator should maintain an output frequency that is substantially constant and predictable with respect to variations in operating power supply. If frequency trimming options are provided, a reduced number of trimming components should be used. Further, the oscillator frequency should be readily adjustable to be a known constant, despite variations in component and device process and fabrication parameters. The oscillator should lend itself to precise frequency multiplication, including multiplication by non-integer multiples, and should provide a programmable frequency multiplication function.

The present invention discloses such an oscillator.

SUMMARY OF THE INVENTION

In a first embodiment, an oscillator is implemented with MOS technology such that the oscillator frequency is substantially independent of power supply Vdd. Frequency trimming is provided to compensate for fabrication tolerances in producing MOS devices and other components, there being no need to compensate for Vdd variation. The oscillator includes a current mirror generator that preferably includes a current coarse trimming component and a current fine trimming component, a voltage comparator pair, an RS flipflop and a programmable delay unit.

Using current mirroring, the generator internally establishes dynamic reference voltages, Vref1, Vref2, Vref3, Vref4 that are based upon MOS threshold voltage drops (Vtp for PMOS, Vtn for NMOS), and are substantially independent of Vdd variations. A core reference current Iosc0 is directly proportional to Vtp/Rload, where Rload is a load resistor. The reference current (Iosc0), or a scaled version thereof (Iosc1), is mirrored within the programmable delay unit and is caused to charge an equivalent value of capacitance $C_{eff}$, whose value is programmably selectable.

Inputs to the voltage comparators are Vref1 and the voltage waveforms appearing across first and second $C_{eff}$ provided by the programmable delay unit. Each comparator outputs an inverted ramp-like waveform that begins at Vdd and decreases linearly until the trip-point Vref1 is reached, whereupon the voltage returns to Vdd. The comparator output voltages toggle the RS flipflop, whose outputs are fed back to the programmable delay unit and used to gate current mirrors therein. One output from the flipflop is the oscillator output signal, which has a period proportional to the product of Rload and $C_{eff}$. Production variations in Rload and $C_{eff}$ may be compensated by programmably adding or subtracting current from the reference current that is mirrored. In a second embodiment, frequency multiplication is provided Other features and advantages of the invention will appear from the following description in which the preferred embodiments have been set forth in detail, in conjunction with the accompanying drawings.

BRIEF DESCRIPTION OF THE DRAWINGS

FIGS. 12A–12L depict voltage versus time waveforms present a various nodes in the frequency multiplying oscillator of FIG. 6, according to the present invention;

DETAILED DESCRIPTION OF THE PREFERRED EMBODIMENTS

Figure 1A:
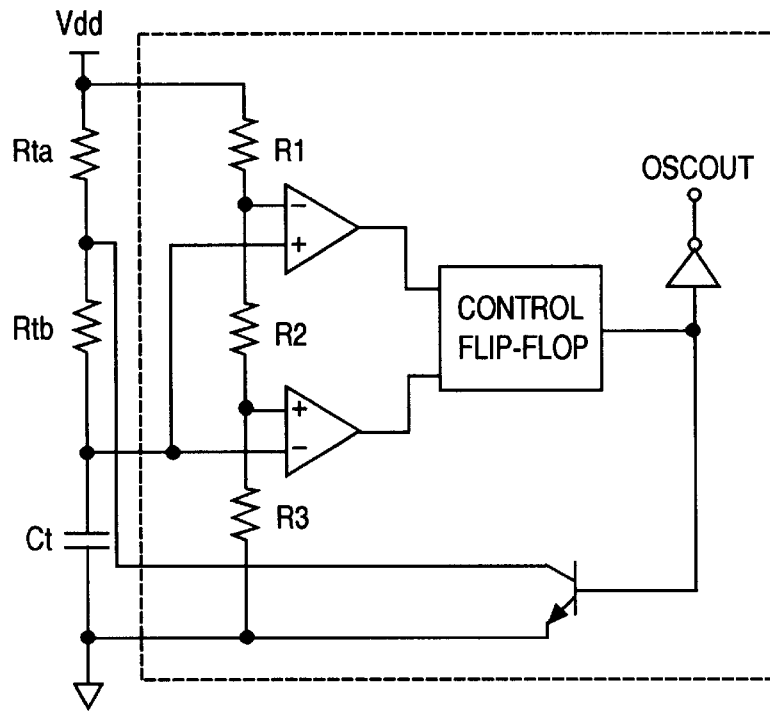
FIGS. 1A and 1B depict conventional oscillator circuits, according to the prior art.
Figure 1B:
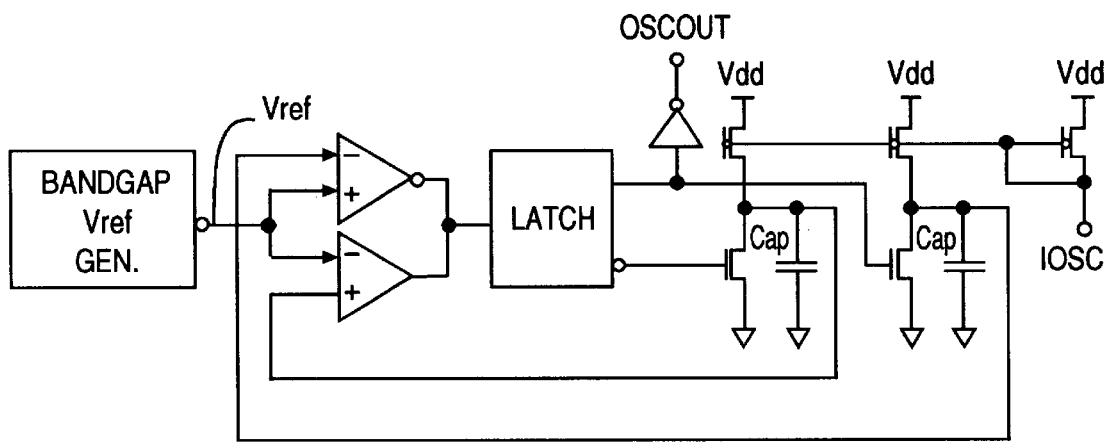
Figure 2:
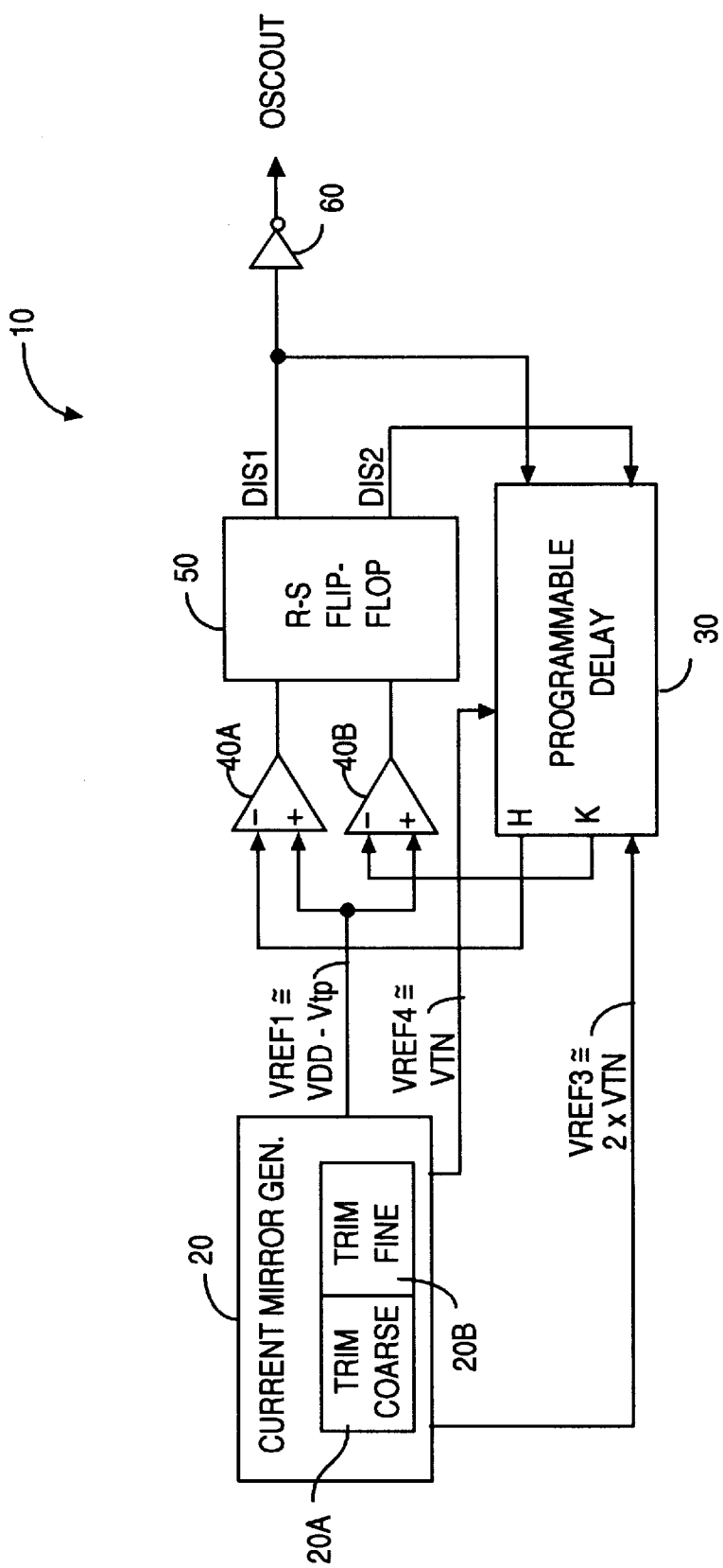
FIG. 2 is a block diagram of an oscillator with coarse and fine trim functions, according to the present invention.

FIG. 2 depicts an oscillator 10 comprising a current mirror generator 20 (and preferably coarse and fine current trimming components 20A, 20B), a programmable delay unit 30, a pair of comparators 40A, 40B, a reset-set ("R-S") flipflop 50, and optionally an inverting buffer 60 that provides an oscillator output signal, OSCOUT. If desired, any or all of oscillator 10 may be fabricated on a single integrated circuit ("IC") chip, using ordinary MOS fabrication processes. Of course, if desired, oscillator 10 may be fabricated using more than one IC.

In contrast to many prior art implementations, current mirror generator 20 does not use bipolar devices, bandgap configurations, or the like, and is implemented entirely using metal on silicon ("MOS") devices. As shown in FIG. 2, generator 20 provides three reference voltages to the remainder of the circuitry. A first reference voltage Vref1 is approximately equal to the power supply voltage Vdd less a P-channel MOS ("PMOS") device threshold voltage drop Vtp, thus Vref1≈Vdd–Vtp. A second (internally used) reference voltage Vref2≈Vtn, where Vtn is the threshold voltage drop of an N-channel MOS ("NMOS") device. A third reference voltage Vref3≈2Vtn, and a fourth reference voltage Vref4≈Vtn. For the devices used, Vtp≈Vtn≦1 VDC, although other devices with larger threshold voltages might instead be used.

The first reference voltage Vref1 is coupled to the non-inverting input nodes of comparators 40A, 40B for use as a lower potential trip point. In contrast to prior art practice, this first reference voltage is dynamic, not static, and will track variations in Vdd such that oscillation frequency is substantially independent of Vdd variations. Within programmable delay unit 30, a capacitor discharges a voltage toward 0 VDC, starting from power supply level Vdd.

The negative inputs of comparators 40A, 40B are coupled to separate H and K nodes associated with programmable delay unit 30. The node potentials seen by the comparator inputs is such that the time of capacitor voltage discharge from Vdd to Vref1 determines the period of the OSCOUT oscillation signal.

The time required to discharge capacitor voltage from Vdd to Vref1 (e.g., from Vdd to Vdd–Vtp) determines the frequency of OSCOUT, according to the equation $$dt=Cdv/i$$

The rate of discharge at programmable delay nodes H, K is determined by MOS devices (see FIG. 4, devices MNH1, MNK1) within the programmable delay unit 30, and by the magnitude of programmable capacitance presented to each of these two nodes. As will be described with reference to FIG. 4, the gates of devices MNH1, MNK1 are coupled to Vref4 (Vref4≈Vtn) so as to mirror sub-current Iosc0×(M/N) created by current mirror generator 20. The outputs from comparators 40A, 40B are input to R-S flipflop 50, whose complementary outputs are denoted DIS1, DIS2. DIS1, DIS2 are fedback to programmable delay unit 30 so as to gate devices MNH1, MNK1 on or off. The result is an OSCOUT signal whose period (or frequency) may be programmably controlled and/or trimmed, which period or frequency is substantially independent of Vdd voltage variations or process variations. The use of a dynamic Vref1 permits system 10 to maintain oscillation frequency constant within about ±1% despite Vdd variations from about 2.5 VDC to 5 VDC or more. In contrast to prior art techniques which must trim for variations in Vdd and for fabrication process variables, the frequency of oscillation for the present invention is substantially independent of Vdd variations, and generally requires no Vdd-compensation trimming.

Figure 3:
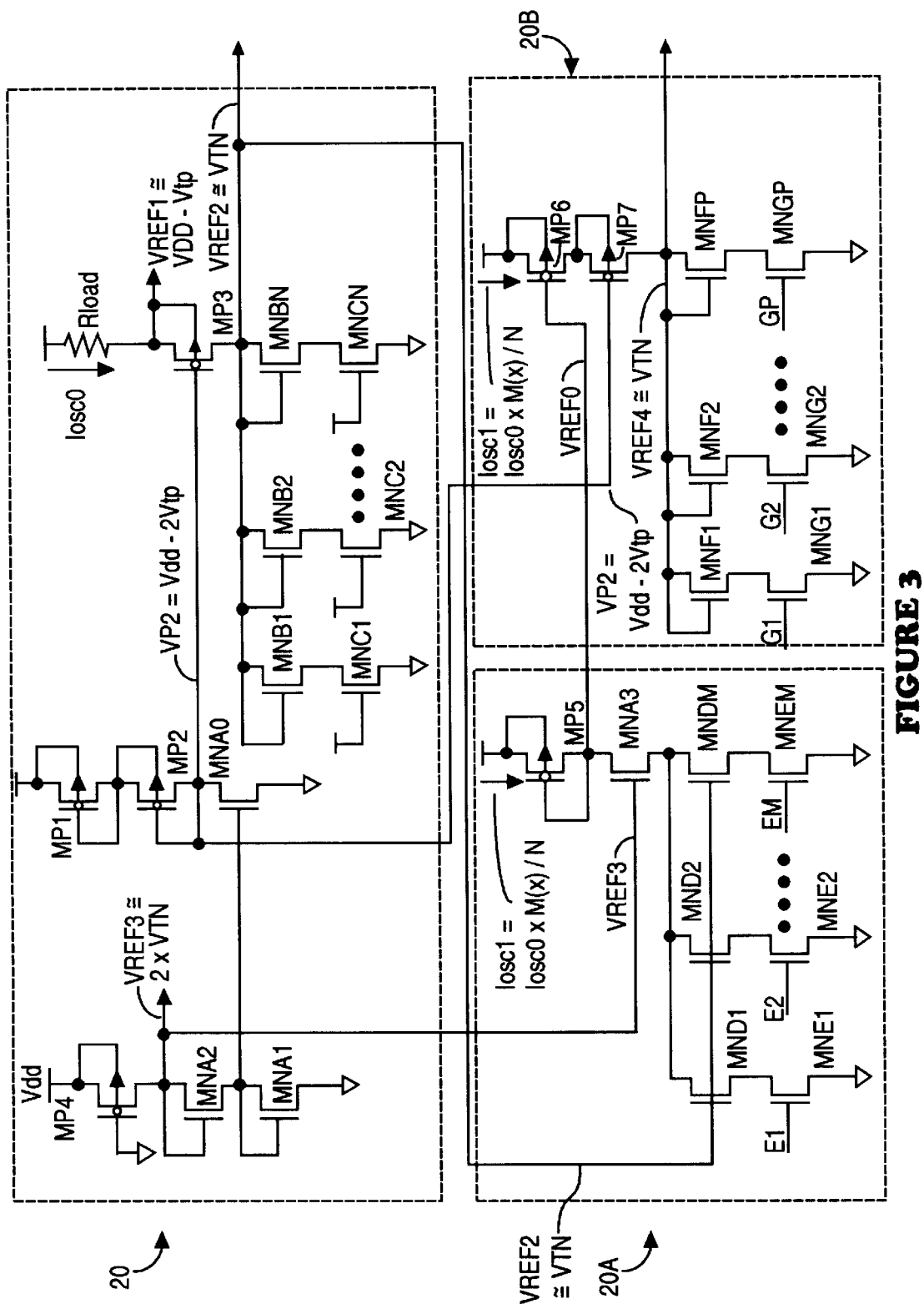
FIG. 3 is a schematic of a preferred implementation of a current mirror generator and coarse/fine tuning functions for the oscillator of FIG. 2, according to the present invention.

FIG. 3 will now be described, namely the preferred implementation of current generating blocks 20, 20A, and 20B (see FIG. 2). Within current mirror generator 20, NMOS devices MNA1 and MNA2 are series-coupled as diodes that each exhibit a voltage drop Vtn, and the third Reference voltage Vref3≈2Vtn is present at the gate-source of MNA2. PMOS devices MP1 and MP2 are series-coupled as diodes that each exhibit a voltage drop Vtp. NMOS device MNA0 self-biases at 1Vtn, which potential is coupled to the gate of NMOS MNA0. The various diode-coupled devices shown in FIG. 3 have their gate-source leads coupled together and preferably are operated in saturation mode. Those skilled in the art will appreciate that saturation mode operation is preferred, as current will be substantially independent of Vdd variations, providing MOS channel length is relatively large, e.g., perhaps 10 $\mu$m.

NMOS MNA0 outputs an intermediate voltage Vp2=Vdd−2Vtp, and the action of PMOS MP3 is such that the first reference voltage Vref1≈Vdd−Vtp. PMOS device MP3 outputs Vref1, which potential is a Vtp diode drop less than the gate potential VP2. Thus, Vref1≈Vdd−Vtp. Note that Vref1 will precisely track changes in power supply Vdd.

In FIG. 3, a load resistor Rload is coupled in series between the Vdd power supply and MP3, and is sized to establish a desired magnitude of reference current Iosc0. Iosc0 is seen to be (Vdd−[Vdd−Vtp])/R, or Vtp/R, which is to say, Iosc0 is substantially constant and is substantially independent of Vdd power supply variations. Within generator 20, the bulk substrates of PMOS devices MP1, MP2, MP3 preferably are coupled to the respective device nodes such that Vtp variation due to device body effect is substantially reduced if not eliminated. Preferably Vref1≈Vdd−Vtp, and Vp2≈Vdd−2Vtp in magnitude, and the channel drain-source resistance of MNA0 is substantially greater than the channel drain-source resistance of MP1 or MP2.

Within block 20, there are a number N of substantially identical parallel-coupled current strings, such as MNB1–MNC1, and MNB2–MNC2, etc. Substantially independently of process variations, these N current strings equally share the current Iosc0 that flows through load resistor Rload, associated with device MP3. Thus, through each of these N current strings there will flow a sub-current equal to Iosc0/N.

In block 20, the magnitude Vref2 is purposely made to be about the value of Vtn for MNB1, MNB2 . . . MNBN by making the drain-source channel resistance of MNC1, MNC2 . . . MNCN extremely small, while making the drain-source channel resistance of MP3 and Rload extremely large relative to MNB1, MNB2 . . . MNBN. The threshold voltage Vtn for MNB1, MNB2 . . . MNBN is equalized by using a common long channel length to reduce modulation effects associated with shorter channel lengths (i.e., Ids vs. Vds variations are more severe for shorter channel devices). Within block 20, MOS channel lengths preferably are in the range of perhaps 5 $\mu$m to 10 $\mu$m, W/L ratios for the devices shown are approximately 2/1, and the reference current Iosc0 is approximately 1 $\mu$A for Vdd ranging from about 2.4 VDC to about 6 VDC, and N is typically perhaps about 5. It will be appreciated that such a wide range of Vdd is possible because the core reference current Iosc0 is generated in a manner making it independent of Vdd. Of course other ratios, currents, voltages, and/or values for N may be used instead.

As shown in FIG. 3, Vref2≈Vtn and Vref3≈2 Vtn are coupled to the current coarse trimming unit 20A, whereas Vref0 is coupled to the current fine trimming unit 20B. The current coarse and fine trimming units 20A, 20B primarily compensate for variations in the fabrication processes used to implement the present invention, including fabrication of on-chip capacitors. It is the function of coarse trimming current generator 20A to provide an adjustable coarse current Iosc1 that is controllably related to the reference current Iosc0 flowing though the load resistor in generator 20. As will be seen, Iosc1=Iosc0×(M/N). By making M>N, it is seen that Iosc1 can exceed the reference current. If M=N, the coarse current will equal the reference current, and if M<N, the coarse current will be less than the reference current. In the preferred embodiment, M>N.

Coarse current trimming unit 20A includes up to M parallel-coupleable series-coupled transistors MNE1–MND1, MNE2–MND2 . . . MNEM–MNDM, where devices MNE1, MNE2 . . . MNEM are switches that are gated on or off as a function of the active or low state of corresponding gate programming voltages E1, E2 . . . EM. In coarse trimming unit 20A, the number of series-coupled transistors conducting current is determined by the number of active (e.g., logic "1") programming gate signals E1, E2 . . . EM. If only one programming gate signal is active, then M=1, if two are active M=2, and so on. It is understood that providing M>N devices MNE1–MND1, MNE2–MND2, etc. permits enabling all M devices, but less than M devices may in fact be gated on by associated programming gate signals.

The maximum coarse current flow Iosc1 in coarse trim unit 20A through PMOS device MP5 is Iosc1=M×(sub-current) or M×(Iosc0/N). Thus, by turning on more or fewer of devices MNE1, MNE2 . . . MNEM, the mirrored coarse current flow Iosc1 through MP5 in coarse trim unit 20A can be made greater than, equal to, or less than the reference current flow Iosc0 through load resistor Rload in unit 20.

By coupling Vref3 (Vref3≈2Vtn) to the gate of NMOS device MNA3 as shown, good current mirroring conditions are promoted in that the drain node potential of MND1, MND2 . . . MNDM will be about Vref2 (Vref2≈Vtn) potential. From the foregoing discussion, it will be appreciated that the coarse trim current Iosc1 tracks the reference current Iosc0 in the ratio (M/N), where preferably N is a fixed number, and M is determined by the number of programming gate signals E1, E2 . . . EM that are active within coarse trimming current generator 20A. If for example N=5, and a coarse trimming current range of about +20% were desired, then M would be made equal to 6, such that the ratio (M/N)=1.20. In practice. a coarse trim current correction of perhaps 10%, and a fine trim current correction of perhaps 2% is readily achieved, if needed.

Within generator 20A, the W/L ratio for the devices used can vary over a wide range, depending upon the oscillation frequency requirements. M will be an integer preferably greater than N, six for example, although other values of M may be used instead.

In the preferred embodiment shown in FIG. 3, a fine trimming current generator 20B is also provided, to which generator is mirrored coarse trimming current Iosc1.

Whereas coarse trimming current generator 20A may be designed to achieve a ±20% or so current change, fine trimming current generator 20B typically is designed to impart perhaps a ±2% or so change in current.

Within generator 20B, the gate of PMOS device MP6 receives the gate-source potential from MP5 (denoted Vref0) in generator 20A, and the gate of PMOS device MP7 receives VP2 ($\approx$Vdd−2Vtp) from generator 20. Within generator 20B are a number P of diode-coupled NMOS devices MNF1, MNF2 . . . MNFP, each in series with an associated gateable device MNG1, MNG2 . . . MNGP. Preferably only a single one of devices MNG1, MNG2, etc. is gated on by an active (e.g., "1" level") programming gate signal, e.g., G1, or G2, etc. In the preferred embodiment, diode-coupled devices MNF1, MNF2, etc. are fabricated with different channel widths to achieve fine tuning of the desired frequency.

PMOS device MP6 in generator 20B is biased to mirror bias applied to PMOS device MP5 in generator 20A. Device MP6 conducts current proportional to Iosc1, as determined by drive signals to MNG1, MNG2, etc. Current mirroring conditions are promoted by coupling VP2$\approx$Vdd−2Vtp to the gate of MP7.

For the devices shown in generator 20B, acceptable W/L ratios may vary widely, channel lengths may typically range from about 5 $\mu$m to about 15 $\mu$m. Depending upon the granularity of the fine current control desired, the number P may be about 10. Of course other channel lengths and channel length deviations, and values for P may be used. As noted, in contrast to the preferred implementation of coarse trim current unit 20A, in the preferred implementation of fine trim current unit 20B, preferably only a single programming gate signal is active, to select a MOS device (e.g., MNF1 or MNF2 or . . . MNFP) whose W/L ratio is appropriate for the magnitude of trim current that is desired. Of course, if desired, more than one programming gate signal could be simultaneously active if, for example, a chosen one of the MOS devices MNF1, MNF2, . . . MNFP did not produce a sufficiently close magnitude of trim current.

Figure 4:
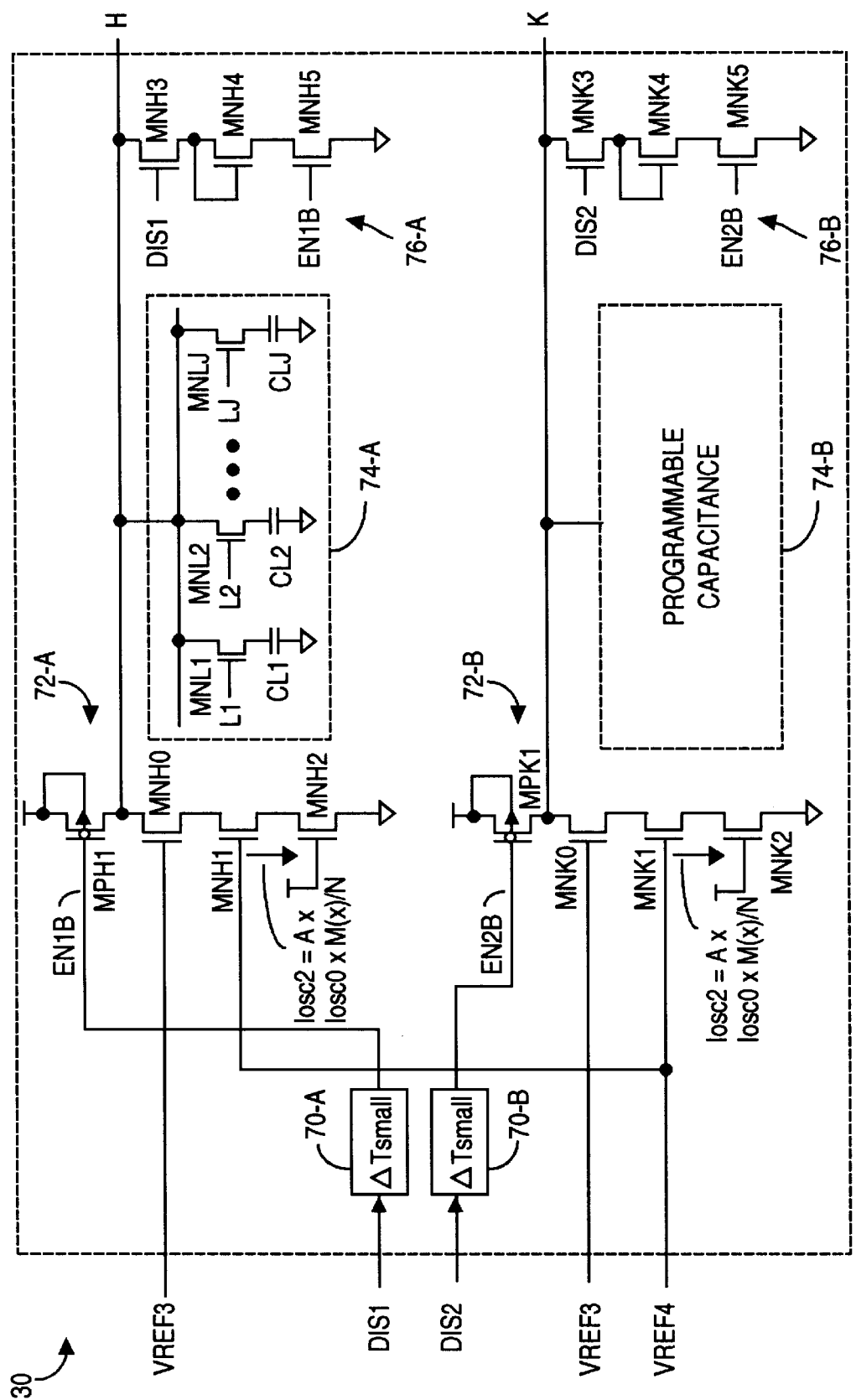
FIG. 4 is schematic of a preferred implementation of a programmable delay unit, according to the present invention.

FIG. 4 depicts a preferred implementation of a programmable delay unit 30 (see FIG. 2). Delay unit 30 receives reference voltages Vref3, Vref4 from generator units 20, 20B (see FIG. 3), complementary output signals DIS1, DIS2 from RS flipflop 50 (see FIG. 2), and has output ports H, K coupled to the inverting input of comparators 40A, 40B respectively (see FIG. 2). As will be described more fully later herein, flipflop signals DIS1, DIS2 are coupled through small magnitude time delay units 70A, 70B to the gates of PMOS transistors MPH1, MPK1 respectively.

Programmable delay unit 30 includes first and second current mirror strings 72-A and 72-B respectively comprising series-connected MOS devices MPH1, MNH0, MNH1, MNH2, and MPK1, MNK0, MNK1, and MNK2, as well as first and second associated programmable capacitance units, 74-A and 74-B. Programmable delay unit 30 also includes first and second anti-noise switching units 76-A, 76-B comprising respectively devices MNH3, MNH4, MNH5, and MNK3, MNK4, MNK5.

In the preferred embodiment, the fine trimming current Iosc1=Iosc0×(M/N) is mirrored through NMOS devices MNH1 and MNK1 in current mirror strings 72-A, 72-B. These mirrored currents are denoted in FIG. 4 as Iosc2=A× Iosc0×(M/N)=Iosc0×(M×A/N). The constant "A" here represents a ratio between channel W/L for MNH1 or MNK1 on one hand, and the channel W/L for any of MNF1, MNF2 . . . MNFP on the other hand (see FIG. 3, generator 20B).

It will be recalled that devices MNF1, MNF2 . . . MNFP preferably are fabricated with a spread of channel widths such that activating an appropriate programming gate signal, e.g., G1 or G2 . . . or GP couples an appropriate device between Vref4 node and ground. For example, in FIG. 4, assume device MNH1 has a 10.2 $\mu$m channel width, and that in FIG. 3, device channel widths are 8 $\mu$m for MNF1, 10 $\mu$m for MNF2, 12 $\mu$m for MNFP. In this example, gate program signal G2 in FIG. 3 will be "1" (and gate program signals G1, . . . GP will be "0"), causing NMOS device MNF2 with its 10 $\mu$m channel width to conduct fine trimming current. With 2 $\mu$m granularity to chose from among transistors MNF1, MNF2 . . . MNFP, it is seen that selecting MNF2 will provide a fine current trimming accuracy within about ±2% (e.g., 10 $\mu$m/10.2 $\mu$m).

As noted above, in FIG. 4, mirrored current flow through MNH1 or MNK1 is Iosc2=Iosc0×(M×A/N), which current flows into programmable capacitance unit 74-A and 74-B. Using programmable capacitance unit 74-A as an example, the mirrored current will flow into one or more timing capacitors CL1, CL2 . . . CLJ, as determined by gate programming signals L1, L2 . . . LJ coupled to the gate of switching transistors such as MNL1, MNL2 . . . MNLJ. Programmable capacitance unit 74-B preferably is similar, although independent gate programming signals may be used. For ease of reference, the effective programmed capacitance from units 74-A and 74-B may be referred to as Cp1, and Cp2 respectively.

In practice, the magnitude of an individual capacitor CL1, CL2, etc. may be in the few pF range, although larger or smaller capacitance values could also be accommodated. In the preferred embodiment, these capacitors may be implemented in a variety of ways, including use of first polysilicon layer, second polysilicon layer (in any IC or ICs used to fabricate the present invention. Often the difference between designed-for capacitance and capacitance as-implemented may be 100% or more, but providing a range of capacitors nonetheless permits incrementing or decrementing as needed to compensate oscillator frequency for fabrication process variations, according to the present invention. Of course the capacitors could be implemented as MOS capacitors, or may even be discrete capacitors, coupled to the IC or ICs in question.

It is helpful at this juncture to examine FIGS. 5A–5G, which depict voltage versus time waveforms seen at various nodes in the configuration of FIG. 4. It will be recalled that signals DIS1 and DIS2 are complementary outputs from flipflop 50 (see FIG. 2). Thus programmable capacitance unit 74-A, e.g., effective capacitance Cp1, will be charging while programmable capacitance unit 74-B, e.g., effective capacitance Cp2, is discharging, and vice versa. Note for example the node H, node K capacitor voltage waveforms of FIGS. 5B and 5C, and the OSCOUT waveform of FIG. 5A. The alternate charging and discharging between the two programmable capacitance units shown in FIGS. 5B, 5C may tend to create different OSCOUT frequencies, but in practice any small additional delay ($\delta$) seen in charging the programmable capacitances to Vdd in a short time is negligible.

The role of the anti-noise NMOS units 76-A, 76-B will now be described. Power line noise associated with the typically 115 VAC–250 VAC primary voltage used to create the operating voltage Vdd can cause the trip point potential seen by the comparators 40A, 40B (FIG. 2) to fluctuate unexpectedly. Such noise "glitches" are especially troublesome when at least some signals being compared by the comparators exhibit a slow voltage/second slewrate at the trip-point transition level. Although R-S flipflop 50 (FIG. 2) is intended to latch the comparator transition states and de-glitch the comparator outputs, more stringent anti-noise measures are recommended. In essence, anti-noise units 76-A, 76-B advantageously hasten the discharge rate of the programmable capacitance units, which reduces the transition time during which noise glitches may be troublesome.

Consider first the operation of anti-noise unit 76-A with respect to ensuring a cleaner signal H. Initially, flipflop 50 (FIG. 2), which latches the comparators' transition state, outputs a DIS1 signal (see FIG. 5D) that is coupled to the gate of NMOS device MNH3. Examining FIGS. 5D and 5F, during the time the DIS1 signal transitions from "0" to "1", the programmable capacitance Cp1 associated with unit 74-A, coupled to node H, is again charged, this time by the action of waveform EN1B, which is coupled to PMOS device MPH1 and to NMOS device MNH5. Waveform EN1B is an inverted version of DIS1 with an additional small time delay. For purposes of the present invention, it is sufficient if the small time delay extends the duration of the "1" state of EN1B beyond the "0" to "1" transition of DIS1. However, the "0" to "1" start of the EN1B waveform could also be slightly delayed. The role of waveforms DIS2, EN2B, and anti-noise unit 76-B and PMOS device MPK1 are similar.

It is seen from the above, that until the effects of the delayed EN1B, EN2B signals are completed, the change from capacitance charging to discharging is delayed. The small accelerated slewrates at the negative-most portions of FIGS. 5B, 5C reflect the additional slewrate contribution from EN1B, EN2B. The transition from VREF1 to Vdd for signals H and K is extremely fast (a few ns or less) and does not enter into the above-derived equations. Neglecting this risetime is unimportant in that the other capacitance associated with the K node begins its discharge when EN2B rises to Vdd. In this fashion, OSCOUT (waveform 5A) is precise and essentially glitch free.

Figure 5:
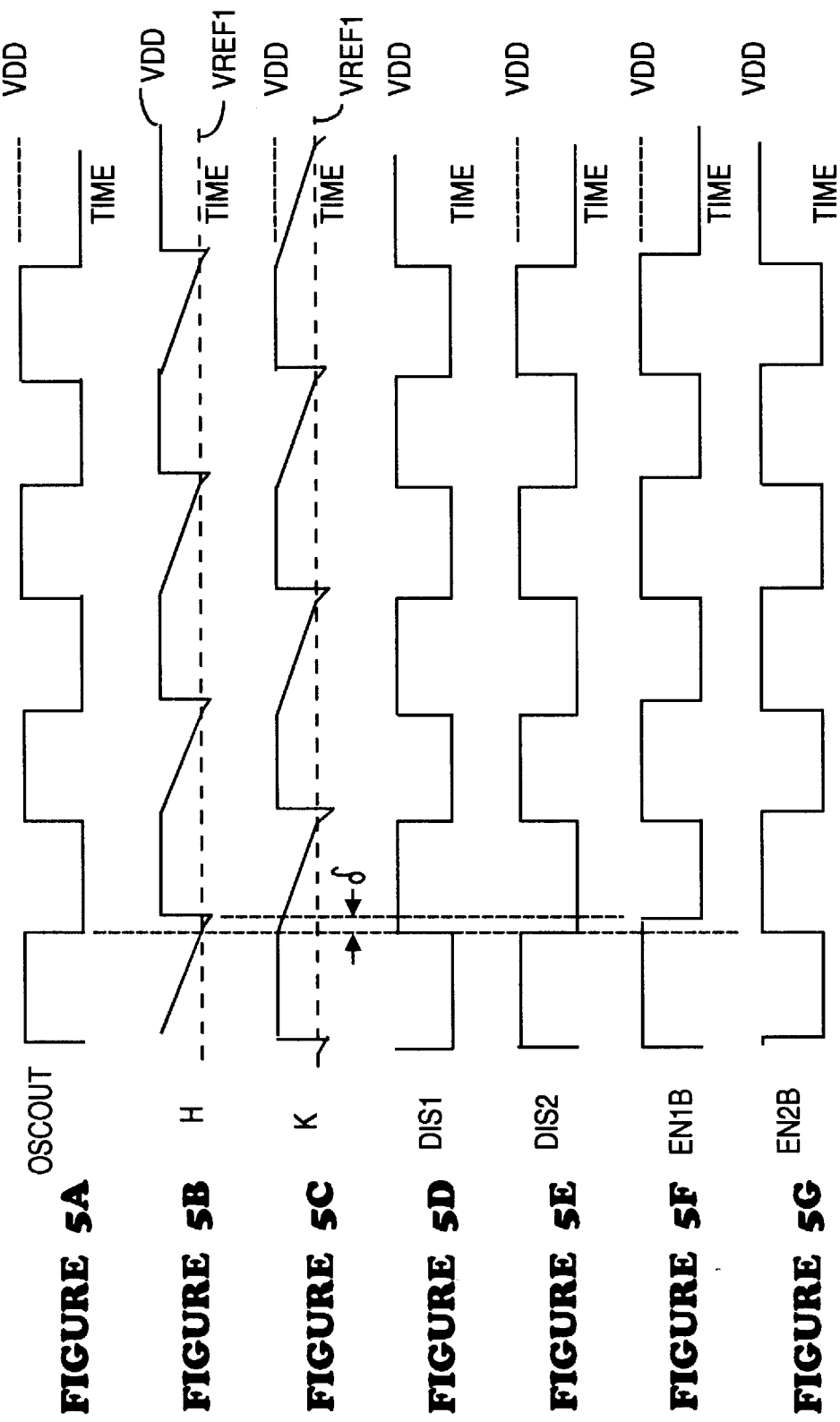
FIGS. 5A–5G depict voltage waveforms as a function of time for various nodes shown in the programmable delay unit of FIG. 4.

The action of comparators 40A, 40B is such that each capacitor discharge (e.g., the effective capacitance $C_{eff}$ associated with programmable capacitance unit 74-A or 74B) starts from the Vdd voltage level and stops at the Vref1 trip point level. As used herein, effective capacitance $C_{eff}$ is the capacitance seen at node H (e.g., Cp1) or at node K (e.g., Cp2), as determined by the on or off states of gate programming signals L1, L2 . . . LJ. This state switching action of the comparators is best seen in FIGS. 5B and 5C, in which the Vdd and Vref1 voltage levels are shown with horizontal dashed lines.

From the equation i=Cdv/dt, it is seen that discharge current into an effective capacitance is given by:

$$i=C_{eff} \times (Vdd-Vref)/T_{discharge}$$

$$i=Iosc2=Iosc0 \times M \times A/N=Ceff \times (Vdd-Vref1)/T_{discharge}$$

In the above equations, discharge time $T_{discharge}$ is:

$$T_{discharge}=C_{eff} \times R_{load} \times N/(M \times A)$$

Thus, the period of oscillation for OSCOUT will be $2 \times T_{discharger}$, which is to say, the oscillation frequency $f_{osc}$ is:

$$f_{osc}=MA/(2 \times C_{eff} \times R_{load} \times N)$$

Note from the above equation, the oscillation frequency is dependent upon M, A, N, $C_{eff}$ and $R_{load}$, and does not depend upon power supply Vdd or a constant current source. Although ratio A and numbers M and N can be controlled, in practice $C_{eff}$ and $R_{load}$ can vary as a function of fabrication process variations. The value of $C_{eff}$, for example, may vary by ±20% due to process variations. Thus, mirror current generator 20 is provided with current trimming, for example, units 20A and/or 20B.

Assume that $C_{eff-pro}$ and $R_{load-pro}$ are prospective or design goal values for capacitance and load resistance, and that $C_{eff-re}$ and $R_{load-re}$ are the real or actual values of capacitance and load resistance, as fabricated. Let the following ratios be formed:

$$B=C_{eff-re}/C_{eff-pro}$$

$$C=R_{load-re}/R_{load-pro}$$

Once any discrepancy between prospective and actually realized components is determined, the present invention permits trimming the discharge period $T_{discharge}$, or simply $T_{dis}$ as follows:

$$T_{dis-pro}=R_{load-pro} \times C_{eff-pro}=R_{load-re} \times C_{eff-re} \times N/(M \times A)$$

From the above equations, it follows that:

$$M \times A/N=[C_{eff-re} \times R_{load-re}]/[C_{eff-pro} \times R_{load-pro}]$$

$$M \times A/N=B \times C$$

In practice, $R_{load}$ may be an external resistor, whose impedance is accurately known. As a result, current trimming will be required substantially only to compensate to variations in $C_{eff}$, which means the trim factor $M \times A/N=B$. Such current trimming as needed is provided by coarse current trimming devices MND1, MND2 . . . MNDM in coarse trimming unit 20A and/or devices MNF1, MNF2 . . . MNFP in fine trimming unit 20B. As earlier described, these MOS devices permit mirroring a proper magnitude of current to discharge $C_{eff}$.

In FIG. 5C, δ represents a negligible delay, described above with respect to the alternate charging/discharging, and essentially does not affect clock frequency. When EN1B is low, MPH1 is enabled, which charges node H but turns-off NMOS device MNH5. For the brief interval δ, both MPH1 and MNH5 are on simultaneously, but MNH5 can preferably sink substantially more current than MPH1 can supply. In FIG. 4, small delay units 70-A, 70-B delay the rising and falling transitions of input signals DIS1 and DIS2. Units 70-A, 70-B may be implemented in many ways, including series-coupling an even number of inverter circuits.

Having described the underlying principles of an oscillator according to the present invention, frequency multiplication of oscillator frequency will now be described with respect to FIG. 6. It is the function of oscillator circuit 100 to multiply the frequency $f_{osc}$ of OSCIN by a number that need not be an integer, and to output as OSCOUT the frequency-multiplied signal. All or part of oscillator 100 shown in FIG. 6 may be implemented on a single IC, preferably using standardized MOS fabrication technology. In practice, the OSCIN signal may represent the direct output of a crystal, for example a 32.768 KHz crystal that is coupled directly between the OSCIN node and ground. Alternatively, the OSCIN signal can be the output signal from a separate oscillator, including an external oscillator whose frequency is to be multiplied.

Oscillator 100 includes a preferably trimmable current mirror generator 20, 20A. 20B, a programmable tracking delay unit 130, a delay unit 140, a comparator pair 40A, 40B, an R-S flipflop 50, and a multiplexer unit 150. If desired, the trimmable current mirror generator may be the same as has been described with respect to FIGS. 2 and 3. Delay unit 140 will be described shortly with respect to FIG. 7, and programmable tracking delay 130 will be described shortly with respect to FIG. 8.

Figure 6:
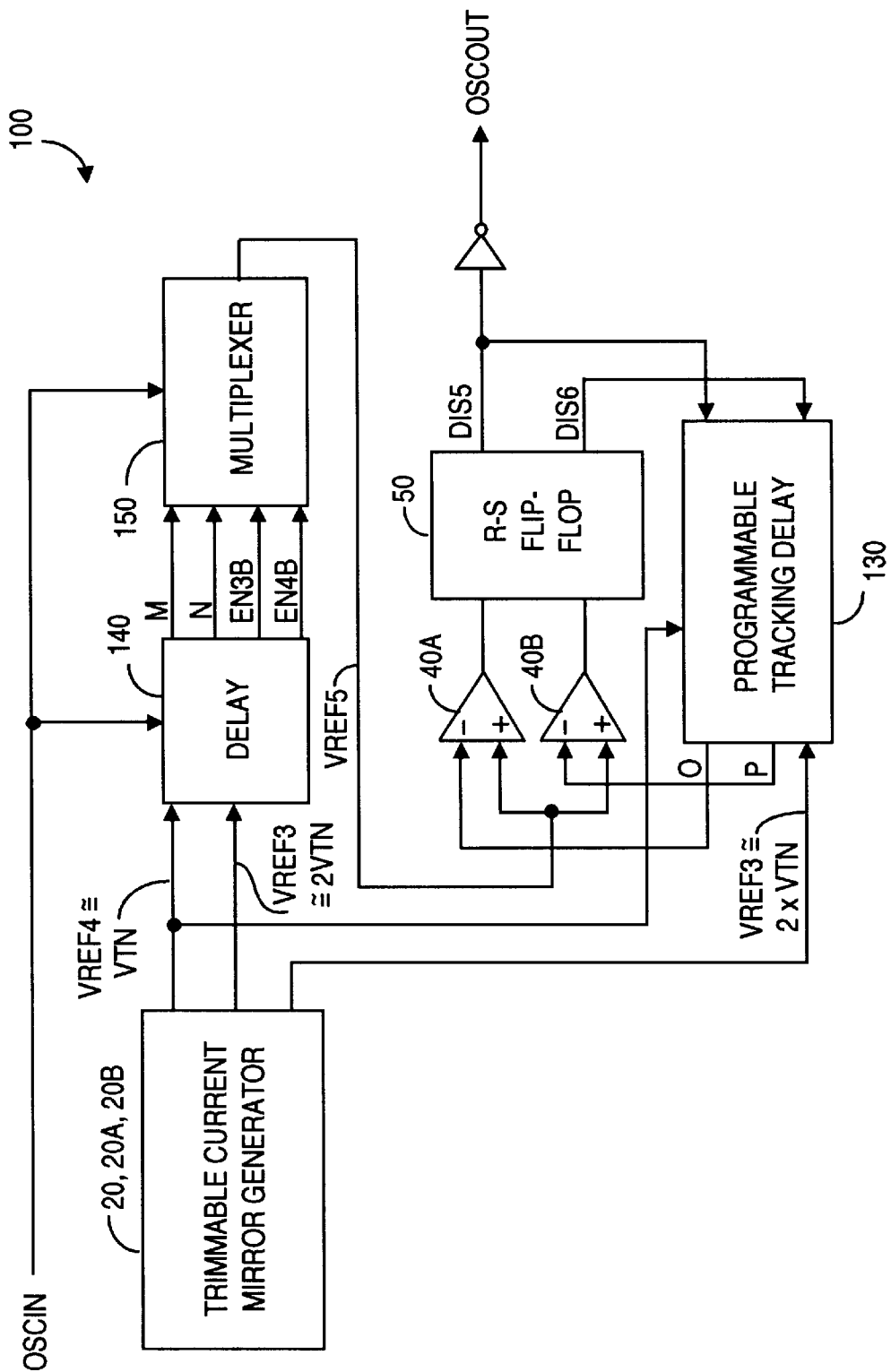
FIG. 6 is a block diagram of an oscillator with frequency multiplication capability, according to an embodiment of the present invention.
Figure 8:
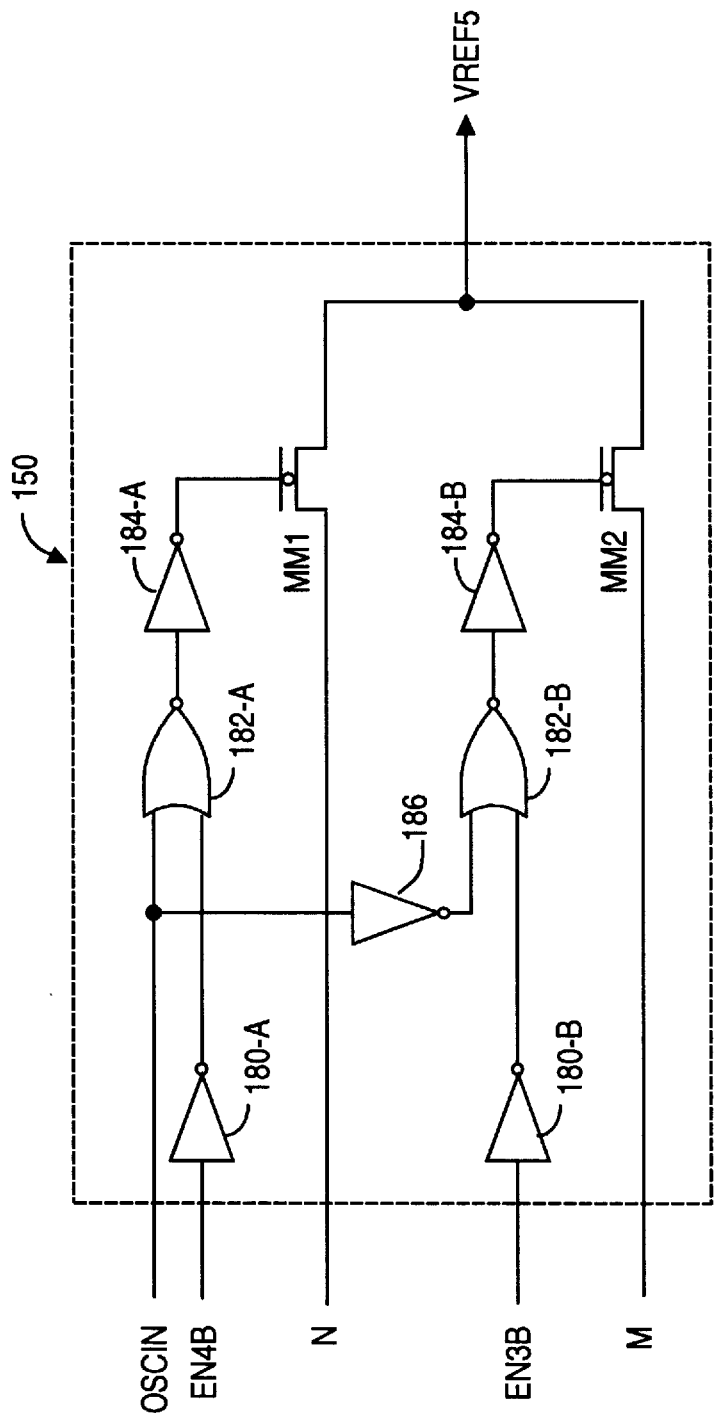
FIG. 8 is a schematic of a preferred implementation of the multiplexer shown in FIG. 6, according to the present invention.

In FIG. 6, delay unit 140 receives as input Vref3 and Vref4 reference voltages from the current generator 20, and an input oscillator signal OSCIN. It is the frequency of OSCIN that is to be frequency-multiplied by oscillator 100. Delay unit 140 tracks the OSCIN signal and outputs two voltage source signals, denoted M and N, as input to multiplexer unit 150. FIGS. 8, 12A and 12B depict the location and nature of signals N and M.

As seen from FIG. 6, FIG. 8, and FIGS. 12A and 12B, multiplexer 150 switcheably outputs a reference voltage Vref5 as a function of the OSCIN signal, as well as input voltages present at nodes M and N, from capacitors C1, C2. Multiplexer 150 includes inverters 180-A, 180-B, 186, 184-A, 184-B, NOR gates 182-A, 182-B, and PMOS devices MM1, MM2. Devices MM1, MM2 are gated on and off by the output state of inverters 184-A, 184-B, in response to the state of OSCIN, EN4B, and EN3B. When MM1 is gated on and MM2 is gated off, Vref5 is level N, and is level M when MM1 is gated off, and MM2 is gated on. The gate-on/-off nature of signals N and M is best seen from the waveforms of FIGS. 12A and 12B, respectively.

As such, reference voltage Vref5 is dynamically generated by multiplexer 150. As seen from FIG. 6, the Vref5 voltage is coupled to the non-inverting inputs of comparators 40A, 40B where it sets a lower voltage trip-point value. As described more fully later herein, programmable tracking delay unit 130 tracks or matches the delay associated with delay unit 140, by switchably presenting more or less capacitance to nodes O and P.

Figure 7:
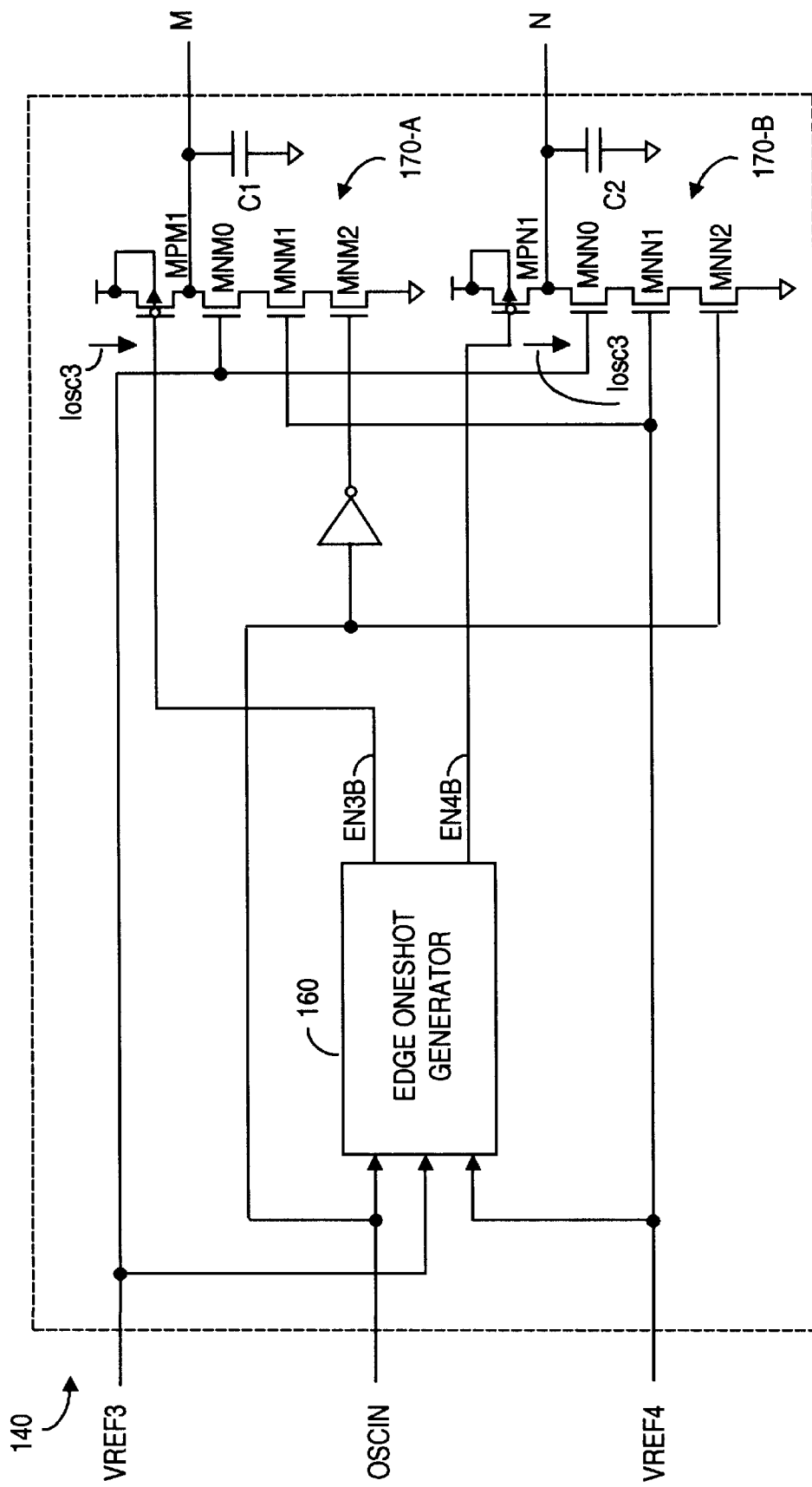
FIG. 7 is a schematic of a preferred implementation of the delay unit show in FIG. 6, according to the present invention.

Turning now to FIG. 7, the operation of delay unit 140 will now be described. As noted, delay unit 140 receives Vref3, Vref4, and OSCIN as input signals, and outputs voltage signals M and N. Delay unit 140 includes an edge one-shot generator 160 (shown in detail in FIG. 9), as well as first and second current mirroring series-coupled MOS transistor strings 170-A and 170-B.

In FIG. 7, the role of Vref4 is similar to what has been described with respect to FIGS. 3 and 4. Vref3 is coupled to the gates of NMOS devices MNM0 and MNN0, and Vref4 is coupled to the gates of NMOS devices MNM1 and MNN1. The gates of PMOS devices MPM1 and MPN1 are coupled to enabling signals EN3B, EN4B output from edge one-shot generator 160.

It is seen from FIGS. 7, 12D, 12C and 12D, respectively, that delay unit 140 creates two delay paths by causing edge one-shot generator 160 to track phase of clock input signal OSCIN in alternative cycles, denoted EN3B, EN4B. Comparing OSCIN (FIG. 12E), EN3B (FIG. 12C), and EN4B (FIG. 12D), it is seen that one-shot output signal EN3B begins with the falling ("1" to "0" transition) of OSCIN, whereas one-shot output signal EN4B begins with the rising ("0" to "1" transition) of OSCIN.

Responsive to the state of signals EN3B, EN4B, transistor strings 170-A, 170-B will each conduct a current Iosc3 that mirrors the current flow Iosc1 in transistor MP6 in generator 20B (see FIG. 3). Of course, Iosc3 can be greater than, equal to, or less than current Iosc1, if channel lengths of devices MPM1 and/or MPM2 are scaled relative to channel lengths of device MP6. Current flow Iosc3 will produce an i=Cdv/dt voltage change in associated capacitors C1 and C2, each of which will typically be in the few pF range. As such, the voltage waveforms M and N, seen across capacitors C1, C2 respectively, are shown in FIGS. 12A, 12B.

Alternatively, capacitors C1, C2 in FIG. 7 are set to a charge state, after which capacitor charge is gradually and preferably linearly discharged by mirrored current Iosc3. Referring to FIGS. 12A, 12B, and 12D, in the embodiment shown, the voltage at node M across capacitor C1 discharges during the "0" or low phase of OSCIN, except for the EN3B-activated period. When the clock input signal OSCIN charges to "1" state, or high phase, capacitor C1 has already been discharged from Vdd to the Vref5 level. No further discharge can occur, and the discharge path in essence shuts down, and as shown in FIG. 12B, the voltage across capacitor C1 at node M will remain at the Vref5 level.

In the above fashion capacitors C1 and C2 provide a Vref5 voltage, alternatively, via multiplexer 150, as described above with respect to FIG. 8. Referring back to FIG. 6, this reference voltage Vref6 is presented to the non-inverting inputs of comparator units 40A, 40B. It is noted that if the magnitude of the load resistor $R_{load}$ and the magnitude of capacitors C1, C2 are selected properly, comparators 40A, 40B can readily operate in a high voltage slew rate, high gain regime. Of course, $R_{load}$ and/or capacitors C1 and/or C2 are variable, given fabrication process uncertainties, but nonetheless may be coarse and/or fine trimmed as described herein.

Figure 9:
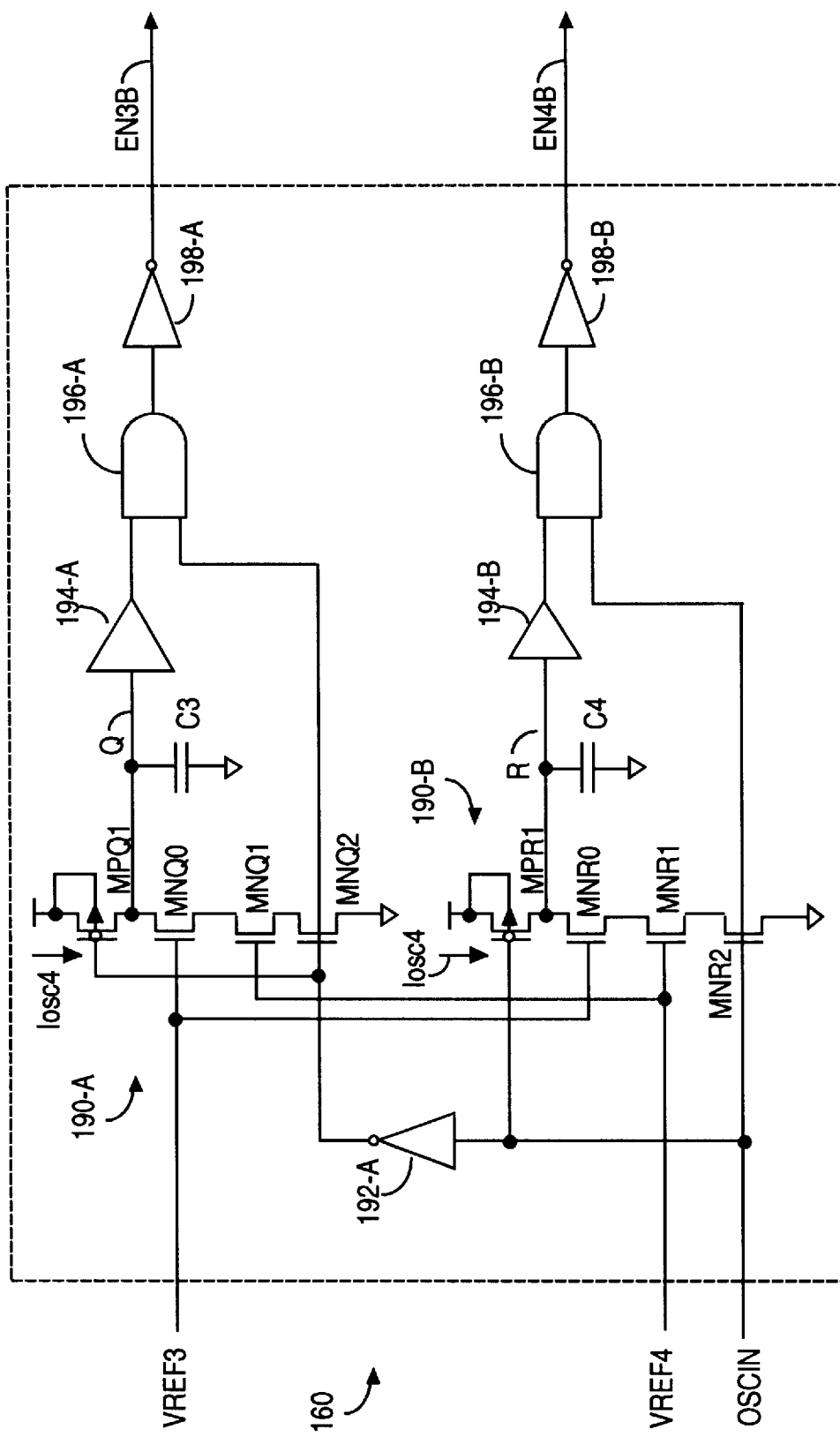
FIG. 9 is a schematic of a preferred implementation of the edge one-shot generator shown in FIG. 7, according to the present invention.

FIG. 9 provides further detail as to a preferred implementation of edge one-shot generator 160, although other configurations may of course be used. As seen from FIGS. 7 and 9, generator 160 receives as input OSCIN, as well as voltage levels Vref3 and Vref4. MOS strings 190-A and 190-B conduct a current Iosc4 that mirrors reference current Iosc0, created by generator 20. (It is understood that Iosc4 can be a scalar multiple of Iosc0.)

Iosc4 current flow into capacitors C3, C4 creates a ramp-like voltage at nodes Q and R that when ANDed with the OSCIN signal (via inverter 192-A, and AND gate 196-A) and node Q ramp (via buffer 194-A) produces the complement of EN3B, shown in FIG. 12C. In similar fashion, waveform EN4B, shown in FIG. 12D is also generated. As noted, FIGS. 12C, 12D, and 12E depict the timing relationship between waveforms OSCIN, EN3B, and EN4B. In the preferred embodiment, EN3B begins with the falling edge of OSCIN, and EN4B begins with the rising edge of OSCIN. The pulse width of EN3B, EN4B is determined in one-shot fashion by the i=Cdv/dt waveforms present at nodes Q and R. As seen from FIG. 7, waveforms EN3B, EN4B from the edge one-shot generator 160 determine the "Vdd-duration" of ramp-like waveforms N and M (see FIGS. 12A, 12B).

Figure 10:
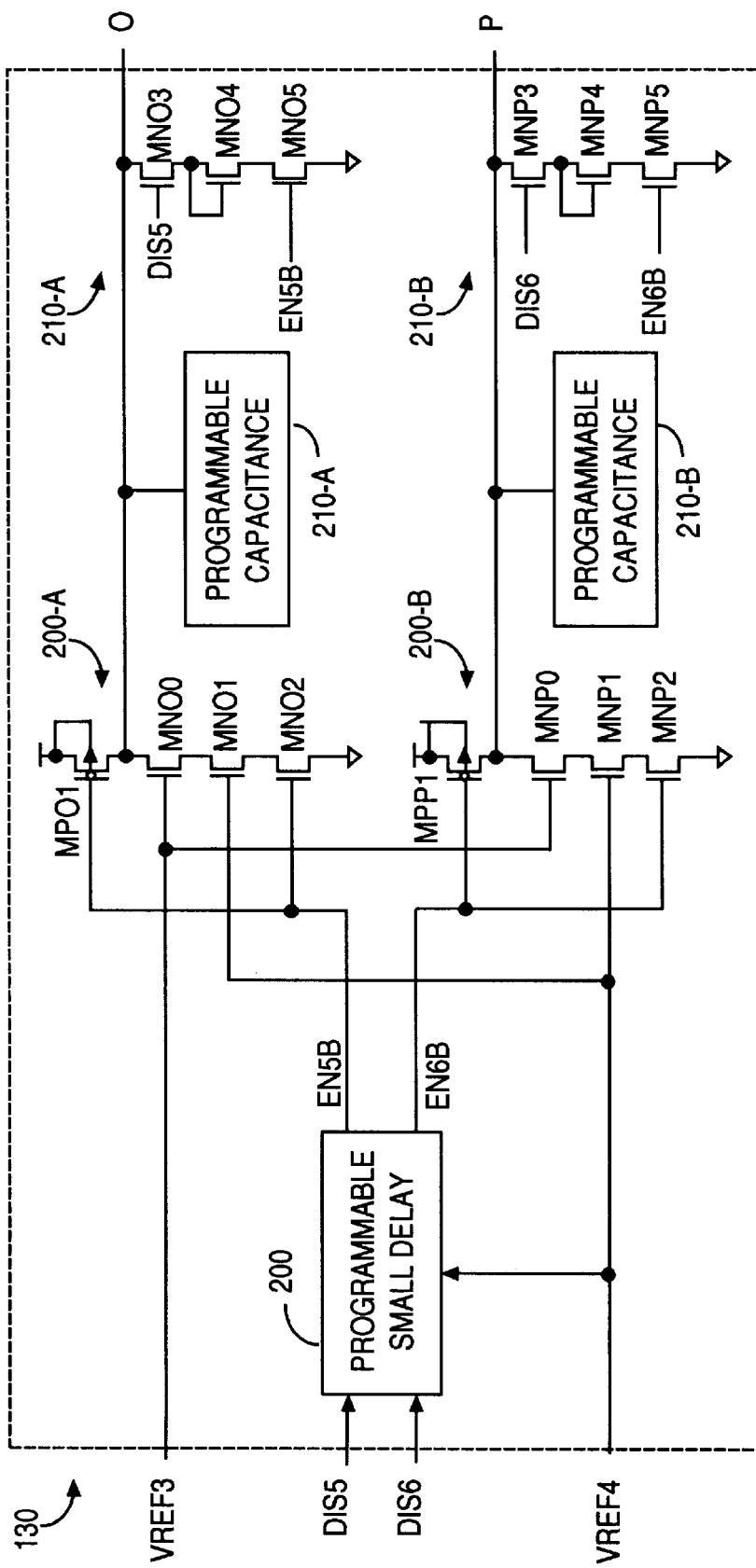
FIG. 10 is a schematic of a preferred implementation of the programmable tracking delay unit shown in FIG. 6, according to present invention.

FIG. 10 depicts a preferred embodiment of programmable tracking delay unit 130. Unit 130 receives as input Vref3 and Vref4 from generator 20, as well as DIS5, DIS6 output signals from flipflop 50 (see FIG. 6). Voltage waveforms for DIS5, DIS6 are shown in FIGS. 12I, 12J, respectively. Unit 130 includes a programmable small time delay unit 200, first and second MOS device strings 200-A, 200-B, first and second programmable capacitance units 210-A, 210-B, and first and second output gate transistor strings 210-A, 210-B.

Time delay unit 200 receives as input flipflop 50 output signals DIS5, DIS6 and outputs therefrom signals EN5B, EN6B. The spatial relationship between these waveforms is seen from FIG. 12I (DIS5). FIG. 12J (DIS6), FIG. 12K (EN5B), and FIG. 12L (EN6B). It is seen that the positive transition of EN5B is time-delayed from the falling transition of DIS5, and that the positive transition of EN6B is time-delayed from the falling transition of DIS6. Those skilled in the art will appreciate that the time-delay (Td) created by unit 200 may be implemented in many ways including, for example, a one-shot and logic, wherein the timing capacitor(s) associated with the one-shot are programmably selectable, such as capacitors CL1, CL2, etc. in programmable capacitance unit 74-A or 74-B (see FIG. 4).

Referring still to FIG. 10, signals EN5B, EN6B are coupled to the gates of MP01 and MN02 in transistor string 200-A, and to the gates of MPP1 and MNP2 in transistor string 200-B. A resultant current Iosc5 is gateably created within MOS devices MP01, MPP1, which current mirrors (with an optional scale factor) reference current Iosc0 created within generator unit 20. This current flow is coupled to programmable capacitance units 210-A, 210-B, which may be similar in implementation to units 74-A, 74-B shown FIG. 4. As shown in FIGS. 12G, 12H, voltages that ramp linearly from Vdd to Vref5 and reset to Vdd appear across the capacitance units to be output as signals O and P, shown in FIGS. 12G and 12H. Transistor strings 210-A, 210-B preferably are provided to serve the same type of anti-noise function as has been described with respect to transistor strings 76-A, 76-B (see FIG. 4).

As seen in FIG. 6, output signals O and P (FIGS. 12G, 12H, respectively) from programmable tracking delay 130 are input to the inverting nodes of comparators 40-A, 40-B, where they are compared against a common trip-point voltage, here Vref5, created by multiplexer 150. R-S flipflop 50 serves an anti-glitch latching role and the complement of DIS5 appears as the OSCOUT signal (see FIG. 12F).

Figure 11:
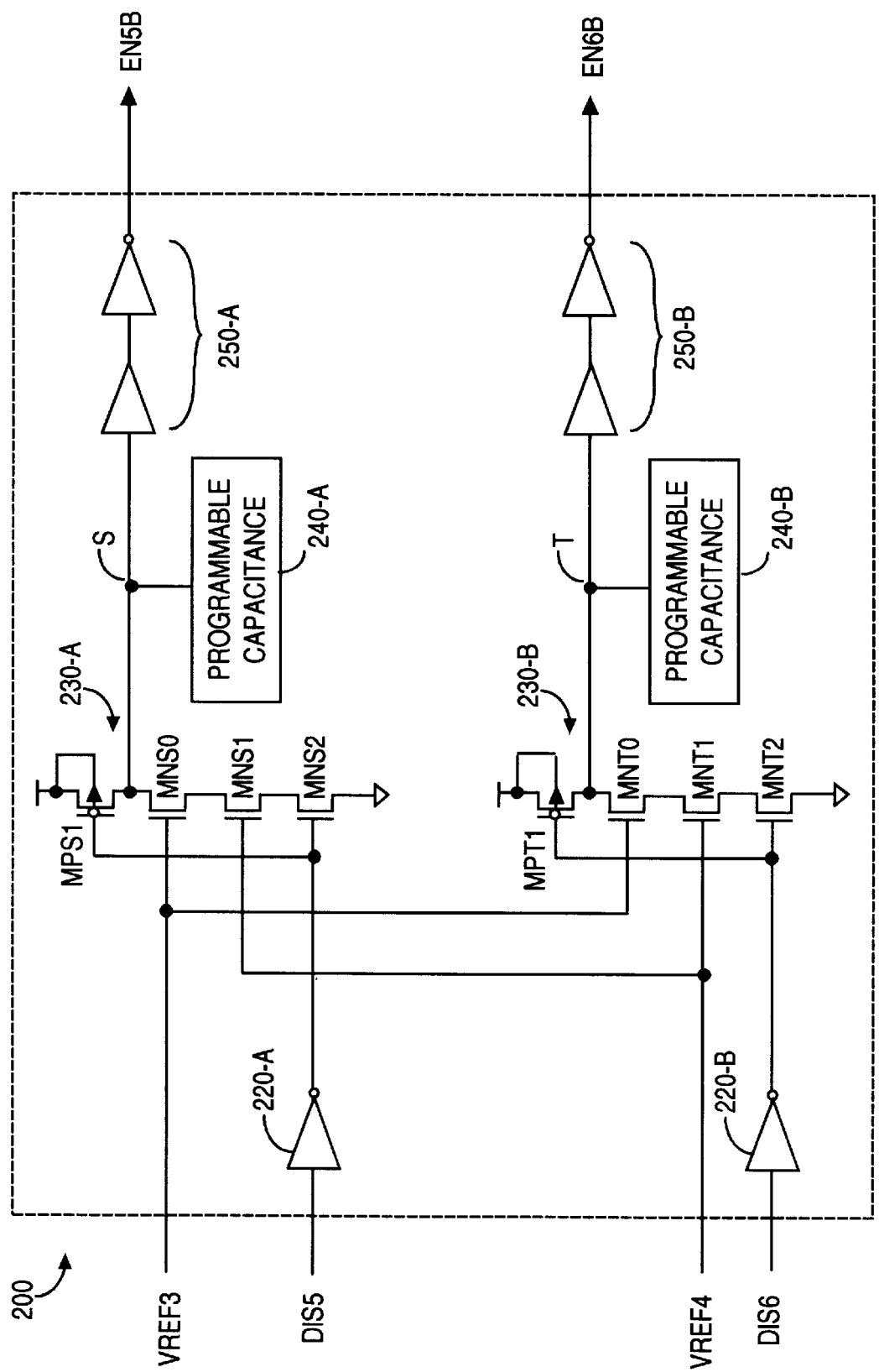
FIG. 11 depicts a programmable small delay unit, such as used in the embodiment of FIG. 10, according to the present invention.

From the foregoing description of FIG. 10, it will be appreciated that two programmable delay paths are provided. One such path uses programmable capacitance units 210A, 210B (whose output signals appear at nodes O and P respectively) to track delay associated with capacitors C1, C2 at nodes M and N, respectively (see FIG. 7). The second such path preferably uses programmable small delay unit 200 to track delay associated with capacitors C3, C4 (whose output signals appear at nodes Q and R in one-shot unit 160, in FIG. 9. FIG. 11 provides details as to a preferred implementation of programmable small delay unit 200. Similar to what has been described earlier, Vref3, DIS5 (see FIG. 12I), Vref4, DIS6 (see FIG. 12J) establish a scaled mirror current flow through transistor strings 230A, 230B. This current flow causes charge loss from capacitance units 240A, 240B such that the voltage at nodes S and T ramp down, similarly to waveforms N or M or O or P. Capacitance units 240A, 240B may be implemented similarly to units 210A, 210B, which is to say in the manner described with respect to programmable capacitance units 74A, 74B (see FIG. 4). Of course other techniques to controllably increment or decrement net effective capacitance magnitudes could instead be used. As shown in FIG. 11, the S and T voltage waveforms are digitized by a buffer-inverter pair, 250A and 250B, to output control voltages EN5B, and EN6B, respectively.

As will now be described, the present invention permits accurate tracking control over the frequency of the OSCOUT signal. Referring to the timing waveform of FIG. 12E, assume that period of the high or "1" phase of OSCIN is Thigh. Assume that the width of the pulse width one-shot signal EN4B (FIG. 12D) is Tshot, and that the discharge period of one-shot EN4B is Tdis. With respect to the programmable tracking delay, this delay comprises a programmable small delay Tsd, and a tracking discharge period Tdisp. Let the period of the multiplied frequency oscillator be Tm.

The following equations are self-evident:

$$Thigh = Tshot + Tdis$$

but, $Tshot = R_{load} \times C4$ (at node R)
and, $Tdis = R_{load} \times C2$ (at node N)

$$Tm = Tsd + Tdisp$$

but $Tsd = R_{load} \times C240A$ (at node S)
and $Tdisp = R_{load} \times C210A$ (at node O)
A ratio X(n) may now be defined, as follows:

$$Thigh/Tm = (C4+C2)/(C240A+C210A) = X(n)$$

Thus, X(n) is the ratio of frequency of OSCOUT/OSCIN, which ratio is determined by capacitance values that may be programmed as required. Note too that it is not required that the ratio X(n) be an integer multiple. Thus, the present invention permits multiplying a base oscillator frequency by integers or by non-integers, as determined by the relevant capacitance values and capacitance ratios.

In practice, the frequency of OSCIN may be in the range of a few KHz to a MHz or so. If, for example, the input frequency of OSCIN is determined by a crystal, perhaps a commonly used 32.768 KHz unit, this frequency can be multiplied by an X(n) of perhaps 30 (or 30.52 for that matter) to output OSCOUT having a frequency in the 1 MHz range. Alternatively, the OSCIN frequency may be generated by an oscillator whose frequency is not crystal controlled.

It will be appreciated that frequency of the OSCOUT signal is substantially independent of variations in power supply Vdd. In practice, the frequency of OSCOUT will be constant within about ±1% despite variations in Vdd of perhaps 2.4 VDC to 6 VDC. Yet, this stability and flexibility to multiply the output oscillator frequency is obtained without need for regulated constant voltage sources, or constant current sources, or bipolar devices.

Frequency trimming options are provided, but require fewer trimming devices than common art approaches.

Further, the voltage discharge magnitudes used in the present invention, namely (Vdd) to (Vdd−Vtp) are advantageously small, which reduces frequency variations due to channel length variation in the MOS devices used to implement the present invention. As a result, improved, e.g., higher, noise immunity is realized, with a faster transition period discharge rate.

As has been described, the use of a dynamic voltage reference rather than a conventional static regulated reference voltage source, helps achieve these design goals. Because bipolar devices are avoided, the parasitic contributions of such devices are simply not present.

For a given fabrication process, capacitance values may be pre-programmed and a constant output frequency for OSCOUT will result. This output frequency will be substantially independent of Vdd variations, and $R_{load}$ and/or capacitance trimming will not generally be required. Such trimming may be used, however, to compensate for fabrication process variations, which is in contrast to prior art designs which must trim to compensate for Vdd and for process variations.

Modifications and variations may be made to the disclosed embodiments without departing from the subject and spirit of the invention as defined by the following claims.

What is claimed is:

1. A pure MOS implementable frequency oscillator operable from a voltage source Vdd, comprising:

a current generator providing a core reference current Iosc0 and a mirrored first trim current Iosc1≈(M/N)× Iosc0, where M and N are each integers and Iosc0 and Iosc1 are each substantially independent of changes in Vdd;

a programmable delay unit including first and second value-programmable capacitors Cp1, Cp2 coupled to said current generator to receive mirrored currents A×(M/N)×Iosc0, where A is a constant proportional to a W/L ratio for a MOS device generating said Iosc1, so as to generate first and second ramp-like voltage signals across said capacitors Cp1 and Cp2 having a voltage slewrate proportional to A×(M/N)×Iosc0/capacitance where capacitance is Cp1 or Cp2;

a comparator unit, coupled to receive said first and second ramp-like voltage signals with a reference voltage proportional to nominal threshold voltage for a MOS device in said current generator, and outputting at least first and second comparator output signals;

logic coupled to receive said first and second comparator output signals and to output an OSCOUT signal of said frequency oscillator;

wherein said OSCOUT signal is fedback to said programmable delay unit to toggle said A×(M/N)×Iosc0 current flow on and off to said first and second value programmable capacitors such that said ramp-like voltage signals are generated alternately across said capacitors Cp1 and Cp2 with a period of oscillation of said OSCOUT signal;

wherein said OSCOUT signal has a frequency that is substantially independent of Vdd, and wherein selecting an integer M trims said frequency to compensate for process variations in fabricating said oscillator.

2. The oscillator of claim 1, wherein said current generator includes a first current source that includes:

a saturated-mode operated series-coupled string of MOS devices in which at least one MOS device is coupled as a diode;

an output series-coupled string of MOS devices to which a load resistor Rload is coupled in series between an output MOS device node and a node receiving said Vdd, wherein a voltage differential across said Rload is (Vdd)−(Vdd−Vt), wherein Vt is a threshold voltage for a MOS device included in said string, and wherein Iosc0≈Vt/Rload; and N substantially identical parallel-coupled current strings coupled to receive said Iosc0 such that each of said current strings conducts a sub-current substantially equal to Iosc0/N.

3. The oscillator of claim 1, wherein said current generator includes a first trim current generator that includes:

a series-coupled string of MOS devices in which a MOS device is coupled as a diode and through which diode-coupled MOS device said mirrored current Iosc1 flows; and M substantially identical parallel-coupled current strings, each of said current strings comprising at least two MOS devices one of which devices is a switch, coupled in parallel to share at least a fraction of said Iosc1 current;

wherein switchably connecting from zero to M of said current strings alters (M/N) and thus alters magnitude of said Iosc1.

4. The oscillator of claim 1, wherein said current generator includes a first current generator that outputs at least two reference voltages selected from a group consisting of (i) a first reference voltage Vref1≈Vdd−Vtp, (ii) a third reference voltage Vref3≈2×Vtn, and (iii) a fourth reference voltage Vref4≈Vtn, where Vtp is threshold voltage of a PMOS device included within said first current generator, and Vtn is threshold voltage of an NMOS device included within said first current generator.

5. The oscillator of claim 1, wherein said current generator includes a first current generator that includes a second trim current generator that provides a mirrored second trim current Iosc1≈A×(M/N)×Iosc0;

said second trim current generator including a series-coupled string of MOS devices in which a MOS device is coupled as a diode through which trim current proportional to said (M/N)×Iosc0 flows, and further including X parallel-coupled current strings, each of said current strings being switchably coupled to permit current flow therethrough;

wherein at least two of said X strings include a MOS device having a W/L ratio different from a MOS device W/L ratio in another of said X strings;

wherein magnitude of fine current flow is alterable by switching at least one said MOS device in one of said X strings to permit current flow therethrough.

6. The oscillator of claim 1, wherein at least one of said first and second value-programmable capacitors comprises a plurality of capacitors each having a common first node, and each having a second node coupled in series with a switch responsive to a logic control signal such that logically closing a said switch couples an associated one of said plurality of capacitors to said oscillator;

wherein more than one said switch may be closed simultaneously, and chosen ones of said plurality of capacitors may have different capacitance values.

7. The oscillator of claim 1, further including circuitry to increase discharge slewrate of end-portions of said ramp-like voltage signals.

8. The oscillator of claim 1, further including:

a delay unit including first and second strings of series-coupled MOS devices and a MOS device coupled as a diode, and further including an edge oneshot generator;

said delay unit coupled to said current generator so as to conduct through each diode-coupled MOS device a current Iosc3 mirroring said core reference current Iosc0;

said edge oneshot generator coupled to receive a clock signal OSCIN as an input signal, and outputting first and second non-overlapping enabling signals coupled to said first and second strings of series-coupled MOS devices;

a first capacitor C1 coupled to receive current from the first string of series-coupled MOS devices, wherein during current flow, a ramp-like voltage signal appears across C1;

a second capacitor C2 coupled to receive current from the second string of series-coupled MOS devices, wherein during current flow, a ramp-like voltage signal appears across C2 such that when C2 is charged with current C1 is discharged and vice versa;

a multiplexer unit, coupled to receive said OSCIN signal and said first and second non-overlapping enabling signals, and having an output coupled to said comparator unit;

said edge oneshot generator including third and fourth strings of series-coupled MOS devices in which a MOS device is coupled as a diode and conducts a current Iosc4 mirroring said core reference current Iosc0;

a third capacitor C3 coupled to receive current from the third string of series-coupled MOS devices, wherein during current flow a ramp-like voltage signal appears across C3;

a fourth capacitor C4 coupled to receive current from the fourth string of series-coupled MOS devices, wherein during current flow a ramp-like voltage signal appears across C4 such that when C4 is charged with current C3 is discharged and vice versa;

wherein said programmable delay unit further includes a programmable small delay unit coupled to receive said OSCOUT signal and coupled to switchably gate current flow to said first and second value-programmable capacitors Cp1, Cp2;

wherein frequency of OSCOUT/OSCIN=(C4+C2)/(Cp1+Cp2), wherein frequency multiplication of OSCIN occurs.

9. The oscillator of claim 8, wherein (C4+C2)/(Cp1+Cp2) is an integer.

10. The oscillator of claim 8, wherein (C4+C2)/(Cp1+Cp2) is not an integer.

11. The oscillator of claim 8, wherein said OSCIN signal is crystal controlled and has a frequency ranging from about 1 KHz to about 2 MHz.

12. A MOS implementable oscillator circuit, operable from a voltage source Vdd, that receives an input clock signal OSCIN, and provides an output clock signal OSCOUT wherein frequency of OSCOUT is the product of K times frequency of OSCIN, where K is an integer or a non-integer, the circuit comprising:

a current generator providing a core reference current Iosc0 and further providing a mirrored first trim current Iosc1≈(M/N)×Iosc0, where M and N are each integers, wherein Iosc0 and Iosc1 are each substantially independent of changes in said Vdd;

a delay unit coupled to receive said input clock signal OSCIN and coupled to said current generator, said delay unit including first and second strings of series-coupled MOS devices in which a MOS device is coupled as a diode, wherein when conducting, current through each diode-coupled MOS device is a current Iosc3 mirroring said core reference current Iosc0, said delay unit further outputting first and second non-overlapping enabling signals coupled respectively to said first and second strings of series-coupled MOS devices;

a first capacitor C1 coupled to receive current from the first string of series-coupled MOS devices, wherein during current flow, a ramp-like voltage signal appears across C1;

a second capacitor C2 coupled to receive current from the second string of series-coupled MOS devices, wherein during current flow, a ramp-like voltage signal appears across C2 such that when C2 is charged with current C1 is discharged and vice versa;

a multiplexer unit, coupled to receive said input clock signal OSCIN, coupled to receive said ramp-like voltage across C1, coupled to receive said ramp-like voltage across C2, and coupled to receive said first and second non-overlapping enabling signals;

a programmable tracking delay unit, coupled to said current generator and including third and fourth strings of series-coupled MOS devices in which a MOS device is coupled as a diode, wherein when conducting, current through each diode-coupled MOS device mirrors said core reference current Iosc0;

a first programmable capacitance C1p coupled to said third string of series-coupled MOS devices so as to create a ramp-like voltage signal across said C1p, C1p having a capacitance magnitude that is programmably selectable;

a second programmable capacitance C2p coupled to said fourth string of series-coupled MOS devices so as to create a ramp-like voltage signal across said C2p, C2p having a capacitance magnitude that is programmably selectable;

a comparator unit coupled to receive and compare a threshold voltage Vt reference generated by said multiplexer unit with each said ramp-like voltage signal appearing across C1p and C2p, and to output at least first and second comparator output signals;

set-reset logic coupled to receive said first and second comparator output signals and to output said output clock signal OSCOUT;

wherein said programmable tracking delay unit includes a programmable small delay unit, coupled to receive said output clock signal OSCOUT and a complement thereof, and to provide third and fourth enabling signals coupled respectively to said third and fourth string of series-coupled MOS devices; and wherein a ratio of frequency of OSCOUT/frequency of OSCIN is given by a ratio (C4+C2)/(C1p+C2p).

13. The oscillator of claim 12, wherein said current generator includes:

a saturated-mode operated series-coupled string of MOS devices in which at least one MOS device is coupled as a diode;

an output series-coupled string of MOS devices to which a load resistor Rload is coupled in series between an output MOS device node and a node receiving said Vdd, wherein a voltage differential across said Rload is (Vdd)−(Vdd−Vt), wherein Vt is a threshold voltage for a MOS device included in said string, and wherein Iosc0≈Vt/Rload; and N substantially identical parallel-coupled current strings coupled to receive said Iosc0 such that each of said current strings conducts a sub-current substantially equal to Iosc0/N.

14. The oscillator of claim 12, wherein said current generator further includes a first trim current generator comprising:

a series-coupled string of MOS devices in which a MOS device is coupled as a diode and through which diode-coupled MOS device said mirrored current Iosc1 flows; and M substantially identical parallel-coupled current strings, each of said current strings comprising at least two MOS devices one of which devices is a switch, coupled in parallel to share at least a fraction of said Iosc1 current;

wherein switchably connecting from zero to M of said current strings alters (M/N) and alters magnitude of said Iosc1.

15. The oscillator of claim 12, wherein at least one of said first and second programmable capacitances C1p and C2p comprises a plurality of capacitors each having a common first node, and each having a second node coupled in series with a switch coupled to a low voltage potential;

wherein activating a switch places an associated one of said capacitors in said oscillator, and wherein more than one switch may be activated, and wherein chosen ones of said capacitors may have different capacitance values.

16. The oscillator circuit of claim 12, wherein said delay unit includes an edge oneshot generator coupled to receive said input clock signal OSCIN, said edge oneshot generator providing said first and second non-overlapping enabling signals that are coupled to said first and second strings of series-coupled MOS devices.

17. The oscillator of claim 12, wherein said input clock signal OSCIN is crystal controlled and has a frequency ranging from about 1 KHz to about 2 MHz.

18. A method for providing a MOS implementable frequency oscillator operable from a voltage source Vdd and having an output frequency substantially independent of Vdd, the method comprising the following steps:

(a) generating a core reference current Iosc0 and a mirrored first trim current Iosc1≈(M/N)×Iosc0, where M and N are each integers, wherein Iosc0 and Iosc1 are each substantially independent of changes in Vdd;

(b) providing a programmable delay unit including first and second value-programmable capacitors Cp1, Cp2 coupled to said current generator to receive mirrored currents A×(M/N)×Iosc0 wherein A is a constant proportional to a W/L ratio for a MOS device generating said Iosc1, so as to generate first and second ramp-like voltage signals across said capacitors Cp1 and Cp2 having a voltage slewrate proportional to A×(M/N)× Iosc0/capacitance, where capacitance is Cp1 or Cp2;

(c) providing a comparator unit, coupled to receive said first and second ramp-like voltage signals with a reference voltage proportional to nominal threshold voltage for a MOS device in said current generator, and outputting at least first and second comparator output signals;

(d) providing logic coupled to receive said first and second comparator output signals and to output an OSCOUT signal of said frequency oscillator;

wherein said OSCOUT signal is fedback to said programmable delay unit to toggle said A×(M/N)×Iosc0 current flow on and off to said capacitors Cp1 and Cp2 such that said ramp-like voltage signals are generated alternately across said capacitors Cp1 and Cp2 with a period of oscillation of said OSCOUT signal;

wherein said OSCOUT signal has a frequency that is substantially independent of Vdd, and wherein selecting at least one of an integer M and a value of A permits trimming said frequency to compensate for process variations in fabricating said oscillator circuit.

19. The method of claim 18, wherein step (a) includes:

(a-1) providing a saturated-mode operated series-coupled string of MOS devices in which at least one MOS device is coupled as a diode;

(a-2) providing an output series-coupled string of MOS devices to which a load resistor Rload is coupled in series between an output MOS device node and a node receiving said Vdd, wherein a voltage differential across said Rload is (Vdd)−(Vdd−Vt), wherein Vt is a threshold voltage for a MOS device included in said string, and wherein Iosc0 ≈Vt/Rload; and (a-3) providing N substantially identical parallel-coupled current strings coupled to receive said Iosc0 such that each of said current strings conducts a sub-current substantially equal to Iosc0/N.

20. The method of claim 18, further including:

(d) externally generating and coupling an OSCIN signal to the programmable delay unit;

(e) providing programmably controllable delay elements in paths between output ports of said set-reset logic and said comparator unit;

wherein said OSCOUT signal has a frequency of oscillation that is a multiple K times frequency of oscillation of said OSCIN signal, wherein K need not be an integer.

* * * * *